United States Patent
Lee

(10) Patent No.: US 8,884,264 B2
(45) Date of Patent: Nov. 11, 2014

(54) VARIABLE RESISTANCE MEMORY DEVICE

(71) Applicant: SK Hynix Inc., Gyeonggi-do (JP)

(72) Inventor: Seung-Hwan Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/736,581

(22) Filed: Jan. 8, 2013

(65) Prior Publication Data
US 2013/0256625 A1 Oct. 3, 2013

(30) Foreign Application Priority Data

Mar. 27, 2012 (KR) .................. 10-2012-0031042

(51) Int. Cl.
*H01L 25/04* (2014.01)
*H01L 45/00* (2006.01)
*H01L 27/24* (2006.01)

(52) U.S. Cl.
CPC ................ *H01L 45/12* (2013.01); *H01L 45/08* (2013.01); *H01L 45/1233* (2013.01); *H01L 45/146* (2013.01); *H01L 27/2463* (2013.01)
USPC ............... 257/5; 438/381; 438/382; 438/486; 438/631; 438/104

(58) Field of Classification Search
CPC ............ H01L 45/1233; H01L 27/2481; H01L 45/146; H01L 45/06; H01L 27/2409; H01L 29/513; H01L 29/66628; H01L 21/28273; H01L 29/66636; H01L 21/28282; H01L 45/1253; H01L 45/04; H01L 45/144; H01L 45/1683; H01L 45/12; H01L 27/2463; G11C 7/00; G11C 5/147; G11C 11/402; G11C 11/4023; G11C 13/0007; G11C 13/0069
USPC .................................. 257/5, 4, 3, 2, E45.002
See application file for complete search history.

(56) References Cited

U.S. PATENT DOCUMENTS

2013/0207065 A1* 8/2013 Chiang .............................. 257/2

* cited by examiner

*Primary Examiner* — Chuong A Luu
*Assistant Examiner* — Rodolfo Fortich
(74) *Attorney, Agent, or Firm* — IP & T Group LLP

(57) ABSTRACT

A variable resistance memory device includes: a pair of first electrodes and a second electrode interposed between the pair of first electrodes; a first variable resistance material layer interposed between one of the first electrodes and the second electrode; and a second variable resistance material layer interposed between the other of the first electrodes and the second electrode, wherein the pair of first electrodes are electrically connected to each other, and a first set voltage and a first reset voltage of the first variable resistance material layer are different from a second set voltage and a second reset voltage of the second variable resistance material layer, respectively.

20 Claims, 9 Drawing Sheets

VARIABLE RESISTANCE MEMORY DEVICE

CROSS-REFERENCE TO RELATED APPLICATIONS

The present application claims priority of Korean Patent Application No. 10-2012-0031042, filed on Mar. 27, 2012, which is incorporated herein by reference in its entirety.

BACKGROUND

1. Field

Exemplary embodiments of the present invention relate to a semiconductor technology, and more particularly, to a variable resistance memory device that stores data using a variable resistance material having different resistance states depending on an applied voltage.

2. Description of the Related Art

Variable resistance memory devices such as ReRAM (Resistive Random Access Memory) and PCRAM (Phase-change Random Access Memory) have been developed. These variable resistance memory devices have a structure in which a variable resistance material layer switching between different resistance states depending on an applied voltage is interposed between two electrodes for applying a voltage across the variable resistance material layer.

Such variable resistance memory devices may be roughly divided into two modes depending on switching characteristics. The modes include a unipolar mode where a set/reset operation occurs with one polarity and a bipolar mode where a set/reset operation occurs with different polarities. Since a variable resistance memory device switching in the bipolar mode exhibits a uniform switching characteristic and performs a reset operation through an electric field, the variable resistance memory device has desirable features such as having a small reset current. FIG. 1 is diagram illustrating the operation of a variable resistance memory device operating in the bipolar mode.

Referring to FIG. 1, an operation where a variable resistance memory device in a high resistance state HRS changes to a low resistance state LRS is referred to as a set operation, and a voltage applied during the set operation is referred to as a set voltage Vset. On the other hand, an operation where a variable resistance memory device in the low resistance state LRS changes to the high resistance state HRS is referred to as a reset operation, and a voltage applied during the reset operation is referred to as a reset voltage Vreset.

Here, the set voltage Vset and the reset voltage Vreset have similar magnitudes while having different polarities from each other. For example, when the set voltage Vset is a negative voltage, the reset voltage Vreset may be a positive voltage having a similar magnitude.

According to an example, when such a variable resistance memory device is in the low resistance state LRS, data '1' is stored therein. Here, when the variable resistance memory device is in the high resistance state HRS, data '0' may be stored therein. That is, the variable resistance memory device switching between the low resistance state LRS and the high resistance state HRS may store one-bit data of 0 or 1.

However, with the increase in integration degree of semiconductor memory devices, implementing multi-level cell capable of storing two or more-bit data therein has been requested. The implementation of the multi-level cell is also requested in the field of variable resistance memory devices. However, since most variable resistance materials have, for example, only two resistance states, it is difficult to implement a multi-level cell.

SUMMARY

An embodiment of the present invention is directed to a variable resistance memory device including a multi-level cell to increase the integration degree.

In accordance with an embodiment of the present invention, a variable resistance memory device includes: a pair of first electrodes and a second electrode interposed between the pair of first electrodes; a first variable resistance material layer interposed between one of the first electrodes and the second electrode; and a second variable resistance material layer interposed between the other of the first electrodes and the second electrode, wherein the pair of first electrodes are electrically connected to each other, and a first set voltage and a first reset voltage of the first variable resistance material layer are different from a second set voltage and a second reset voltage of the second variable resistance material layer, respectively.

In accordance with another embodiment of the present invention, a variable resistance memory device includes: a plurality of first electrodes alternately stacked with a plurality of second electrodes; and a plurality of variable resistance material layers interposed between different pairs of adjacent ones of the first electrodes and the second electrodes, respectively, wherein the plurality of first electrodes are electrically connected to each other, the plurality of second electrodes are electrically connected to each other, and the plurality of variable resistance material layers respectively have different set voltages and reset voltages.

In accordance with further another embodiment of the present invention, a pair of first electrodes and a second electrode interposed between the pair of first electrodes; a first variable resistance material layer interposed between one of the first electrodes and the second electrode; and a second variable resistance material layer interposed between the other of the first electrodes and the second electrode, wherein the pair of first electrodes are controlled together.

DETAILED DESCRIPTION

Figure 1:
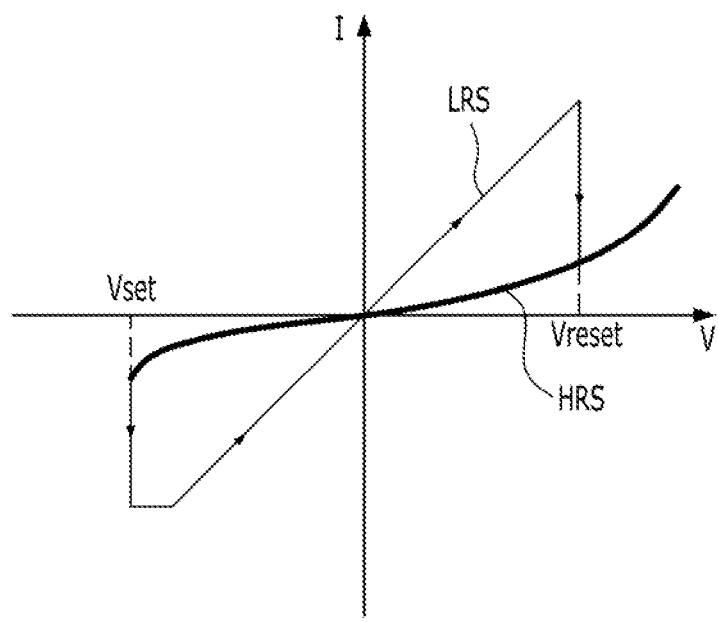
FIG. 1 is diagram illustrating the operation of a variable resistance memory device operating in the bipolar mode.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 2A:
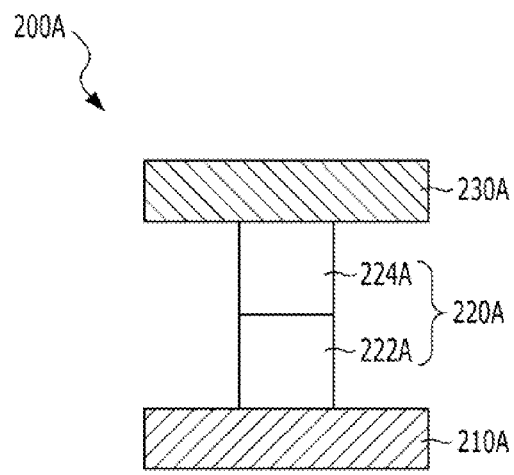
FIGS. 2A to 2F are diagrams illustrating a unit cell of a variable resistance memory device and an operation method thereof in accordance with an embodiment of the present invention.
Figure 2B:
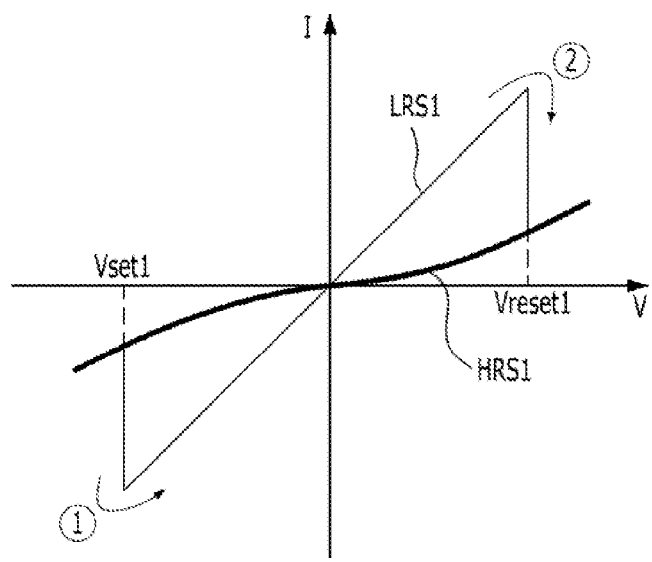
Figure 2C:
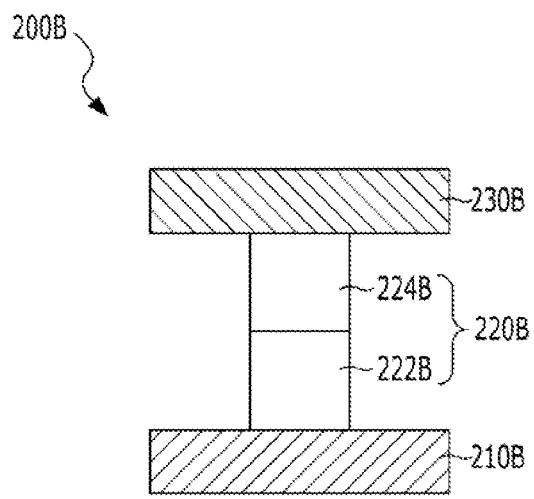
Figure 2D:
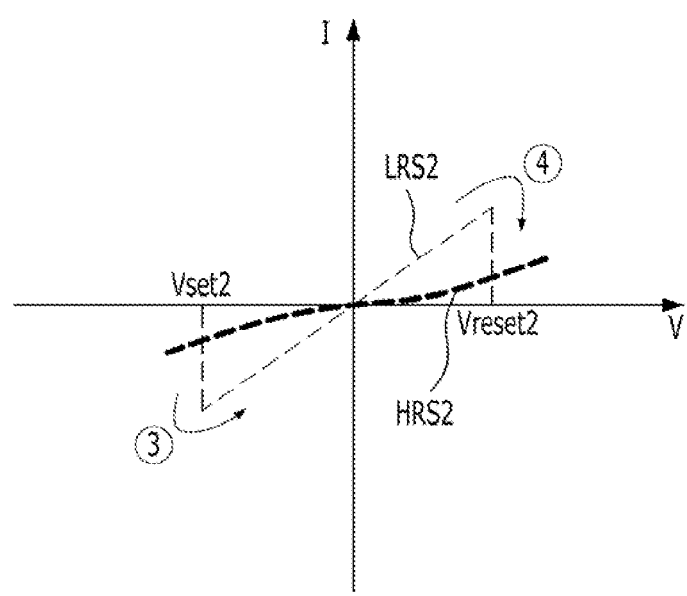
Figure 2E:
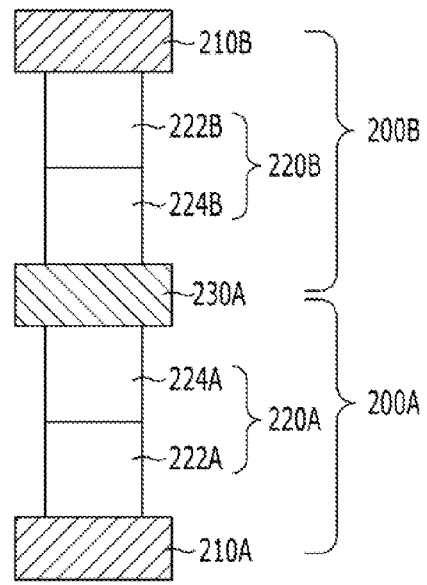
Figure 2F:
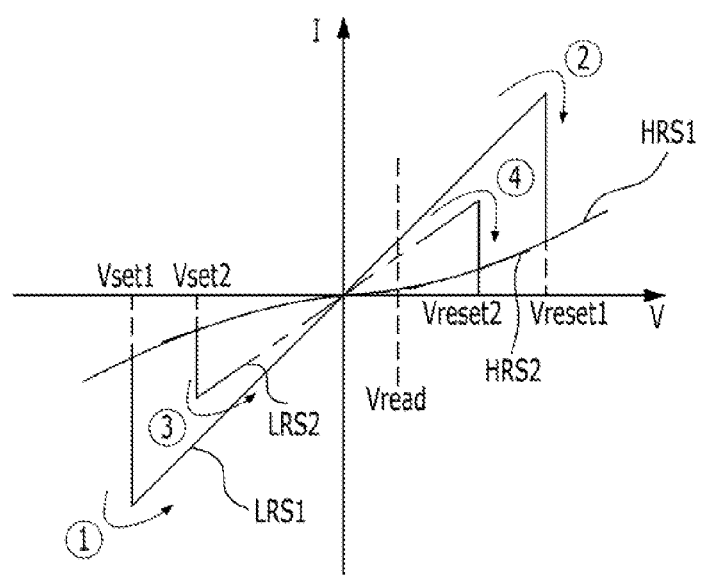

FIGS. 2A to 2F are diagrams illustrating a unit cell of a variable resistance memory device and an operation method thereof in accordance with an embodiment of the present invention. Specifically, FIGS. 2E and 2F illustrate the unit cell in accordance with the embodiment of the present invention and the operation thereof, FIGS. 2A and 2B illustrate a first structure 200A forming a part of the unit cell of FIG. 2E and the operation thereof, and FIGS. 2C and 2D illustrate a second structure 200B forming the other part of the unit cell of FIG. 2E and the operation thereof.

Referring to FIGS. 2A and 2B, the first structure 200A includes a first electrode 210A, a second electrode 230A, and a first variable resistance material layer 220A interposed between the first and second electrodes 210A and 230A.

The first and second electrodes 210A and 230A serve to apply a voltage to the first variable resistance material layer 220A, and may include a conductive material, for example, a metal such as platinum (Pt), tungsten (W), aluminum (Al), copper (Cu), or tantalum (Ta) or a metal nitride such as titanium nitride (TiN) or tantalum nitride (TaN). While FIG. 2A illustrates that the first electrode 210A is positioned under the second electrode 230A, the present invention is not limited thereto. For example, the positions of the first and second electrodes 210A and 230A may be changed in position upside down. Alternatively, the first and second electrodes 210A and 230A may be positioned at the same layer and spaced from each other in a horizontal direction.

The first variable resistance material layer 220A includes a material switching between two resistance states, i.e., a low resistance state LRS1 and a high resistance state HRS1 depending on a voltage applied across the first variable resistance material layer 220A. In the embodiment of the present invention, the first variable resistance material layer 220A may include a material switching in the bipolar mode according to a voltage applied across the first variable resistance material layer 220A. That is, a set operation where the resistance state of the first variable resistance material layer 220A changes from the high resistance state HRS1 to the low resistance state LRS1 (refer to ①) and a reset operation where the resistance state of the first variable resistance material layer 220A changes from the low resistance state LRS1 to the high resistance state HRS1 (refer to ②) are performed at voltages having different polarities. The voltages during the set operation and the reset operation of the first variable resistance material layer 220A are referred to as a first set voltage Vset1 and a first reset voltage Vreset1, respectively.

The first variable resistance material 220A may be formed using a single layer or multilayer including an oxide of a transition metal such as Ta, Ni, Ti, Fe, Co, Mn, or W, a perovskite-based material, and a solid electrolyte such as GeSe. In this embodiment of the present invention, the first variable resistance material layer 220A may have a stacked structure of a switching layer 222A where a current path filament is formed or vanished according to the creation/elimination of oxygen vacancies and an oxygen supply layer 224A for supplying oxygen to the switching layer 222A. Here, the switching layer 222A may include TaOx where x is less than 2.5, and the oxygen supply layer 224A may include TiOy where y is less than 2.0. However, the present invention is not limited thereto, and any materials having a variable resistance characteristic may be used as the first variable resistance material layer 220A.

Referring to FIGS. 2C and 2D, the second structure 200B includes a first electrode 210B, a second electrode 230B, and a second variable resistance material layer 220B interposed between the first and second electrodes 210B and 230B.

The first and second electrodes 210B and 230B may include a conductive material and may be formed of the same material as the first and second electrodes 210A and 230A of the first structure 200A.

The second variable resistance material layer 220B includes a material switching between two resistance states, i.e., a low resistance state LRS2 and a high resistance state HRS2 depending on a voltage applied across the second variable resistance material layer 220A. In particular, a material switching in the bipolar mode may be used as the second variable resistance material 220B. That is, a set operation where the second variable resistance material layer 220B changes from the high resistance state HRS2 to the low resistance state LRS2 (refer to ③) and a reset operation where the second variable resistance material layer 220B changes from the low resistance state LRS2 to the high resistance state HRS2 (refer to ④) are performed at voltages having different polarities. The voltages during the set operation and the reset operation of the second variable resistance material layer 220B are referred to as a second set voltage Vset2 and a second reset voltage Vreset2, respectively.

Here, the second set voltage Vset2 is different from the first set voltage Vset1, and the second reset voltage Vreset2 is different from the first reset voltage Vreset1. For example, as illustrated in FIGS. 2B and 2D, the second set voltage Vset2 and the second reset voltage Vreset2 may be smaller than the first set voltage Vset1 and the first reset voltage Vreset1, respectively.

For this configuration, the second variable resistance material layer 220B may be formed of a different material from the first variable resistance material layer 220A. Alternatively, the second variable resistance material layer 220B may be formed of the same material as the first variable resistance material layer 220A while having a different thickness and/or width from the first variable resistance material layer 220A. In this embodiment of the present invention, the second variable resistance material layer 220B may have a stacked structure of a switching layer 222B and an oxygen supply layer 224B. In this case, the switching layer 222B may be formed of a different material from the switching layer 222A or may have a different thickness and/or width from the switching layer 222A, and the oxygen supply layer 224B may be formed of a different material from the oxygen supply layer 224A or may have a different thickness and/or width from the oxygen supply layer 224A.

Referring to FIGS. 2E and 2F, the unit cell of the variable resistance memory device in accordance with the embodiment of the present invention has a structure in which the first structure 200A of FIG. 2A and the second structure 200B of FIG. 2C are stacked while sharing one electrode, for example, the second electrode 230A or 230B. Hereafter, the shared second electrode is represented by 230A, for illustration purposes.

Specifically, the unit cell in accordance with the embodiment of the present invention includes a pair of first electrodes 210A and 210B, a second electrode 230A interposed between the pair of first electrodes 210A and 210B, a first variable resistance material layer 220A interposed between the second electrode 230A and the first electrode 210A positioned at a lower position between the pair of the first electrodes 210A and 210B, and a second variable resistance material layer 220B interposed between the second electrode 230A and the first electrode 210B positioned at an upper position between the pair of the first electrodes 210A and 210B. In the unit cell in accordance with the embodiment of the present invention, the second electrode 230A of the first and second structures 200A and 200B is shared. Therefore, any one structure of the first and second structures 200A and 200B, for example, the second structure 200B of FIG. 2C may be disposed upside down without changing its functions. For example, when the second variable resistance material layer 220B has a structure in which the switching layer 222B and the oxygen supply layer 224B are stacked as bottom and top layers, respectively, as illustrated in FIG. 2C, the second variable resistance material layer 220B in the unit cell of FIG. 2E has a structure in which the switching layer 222B and the oxygen supply layer 224B are stacked as top and bottom layers, respectively.

At this time, the pair of first electrodes 210A and 210B may be electrically connected to each other through a conductor (not illustrated) and thus be controlled together. Since the pair of first and second electrodes 210A and 210B are electrically connected and the second electrode 230A is shared, the voltage applied across the first variable resistance material layer 220A and the voltage applied across the second variable resistance material layer 220A are equal to each other, according to an example.

Such a unit cell may operate according to the following method.

First, suppose that both of the first and second variable resistance material layers 220A and 220B are in the high resistance states HRS1 and HRS2, respectively. In this case, when the voltage applied across the first and second variable resistance material layers 220A and 220B is dropped, a set operation where the second variable resistance material layer 220B changes from the high resistance state HRS2 to the low resistance state LRS2 is performed at a time point where the voltage reaches the second set voltage Vset2 (refer to ③). On the other hand, the high resistance state HRS1 of the first variable resistance material layer 220A is maintained at the second set voltage Vset2. In FIG. 2F, curves indicating that the first and second variable resistance materials 220A and 220B are in the high resistance states HRS1 and HSR2, respectively, seem to overlap each other. However, this is exemplary only, and the curves may also be designed not to overlap.

Then, when the voltage applied across the first and second variable resistance material layers 220A and 220B is further dropped, a set operation where the first variable resistance material layer 220A changes from the high resistance state HRS1 to the low resistance state LRS1 is performed at a time point where the voltage reaches the first set voltage Vset1 (refer to ①). Since the voltage was dropped, the low resistance state LRS2 of the second variable resistance material layer 220B is maintained.

Then, when the voltage applied across the first and second variable resistance material layers 220A and 220B is raised, a reset operation where the second variable resistance material layer 220B changes from the low resistance state LRS2 to the high resistance state HRS2 is performed at a time point where the voltage reaches the second reset voltage Vreset2 (refer to ④). On the other hand, the low resistance state LRS1 of the first variable resistance material layer 220A is maintained at the second reset voltage Vreset2.

Then, when the voltage applied across the first and second variable resistance material layers 220A and 220B is further raised, a reset operation where the first variable resistance material layer 220A changes from the low resistance state LRS1 to the high resistance state HRS1 is performed at a time point where the voltage reaches the first reset voltage Vreset1 (refer to ②). Since the voltage was raised, the high resistance state HRS2 of the second variable resistance material layer 220B is maintained.

As a result, the unit cell in accordance with the embodiment of the present invention may switch among four states depending on the voltage conditions. The four states include a first state in which the first and second variable resistance material layers 220A and 220B are in the high resistance states HRS1 and HRS2, respectively, a second state in which the first variable resistance material layer 220A is in the high resistance state HRS1 but the second variable resistance material layer 220B is in the low resistance state LRS1, a third state in which the first and second variable resistance material layers 220A and 220B are in the low resistance states LRS1 and LRS2, respectively, and a fourth state in which the first variable resistance material layer 220A is in the low resistance state LRS1 but the second variable resistance material layer 220B is in the high resistance state HRS2. When the unit cell is in the first state, the second state, the third state, and the fourth state, the unit cell may store data '00', '01', '11', and '10', respectively. Therefore, the unit cell may store two-bit data.

A read operation for reading data stored in the unit cell may be performed by applying a voltage ranging from the second set voltage Vset2 to the second reset voltage Vreset2 across the first and second variable resistance material layers 220A and 220B. For example, when a positive voltage having a smaller magnitude than the second reset voltage Vreset2 is applied as a read voltage Vread as illustrated in FIG. 2F, the state that the first variable resistance material layer 220A is in (the high resistance state HRS1 or the low resistance state LRS1) and the state that the second variable resistance material layer 220B is in (the high resistance state HRS2 or the low resistance state LRS2) may be determined. By using the status determination, the state that the unit cell is in, among the first to fourth states, may be determined. Accordingly, the corresponding state may be read.

The above-described unit cell includes a pair of electrodes, a common electrode interposed between the pair of electrodes, and two variable resistance material layers interposed between any one of the electrodes and the common electrode and between the other of the electrodes and the common electrode, respectively. The pair of electrodes are controlled together, and the two variable resistance material layers are formed of materials having different set voltages and reset voltages. Therefore, the unit cell may store two-bit data.

Meanwhile, although not illustrated, the unit cell of FIG. 2E may further include selection elements connected in series to the first and second variable resistance materials 220A and 220B, respectively. Specifically, the selection elements do not substantially pass a current at voltages below a predetermined voltage, but the current flow rapidly increases at voltages over the predetermined voltage. The unit cell in accordance with the embodiment of the present invention may include the selection elements, in order to prevent leakage current in a cross-point structure or the like. The selection elements may include diodes or NPN transistors, for example. The selection elements may be interposed between the first and second variable resistance material layers 220A and 220B and the first electrode 210A or 210B or between the first and second variable resistance material layers 220A and 220B and the second electrode 230A.

Figure 3A:
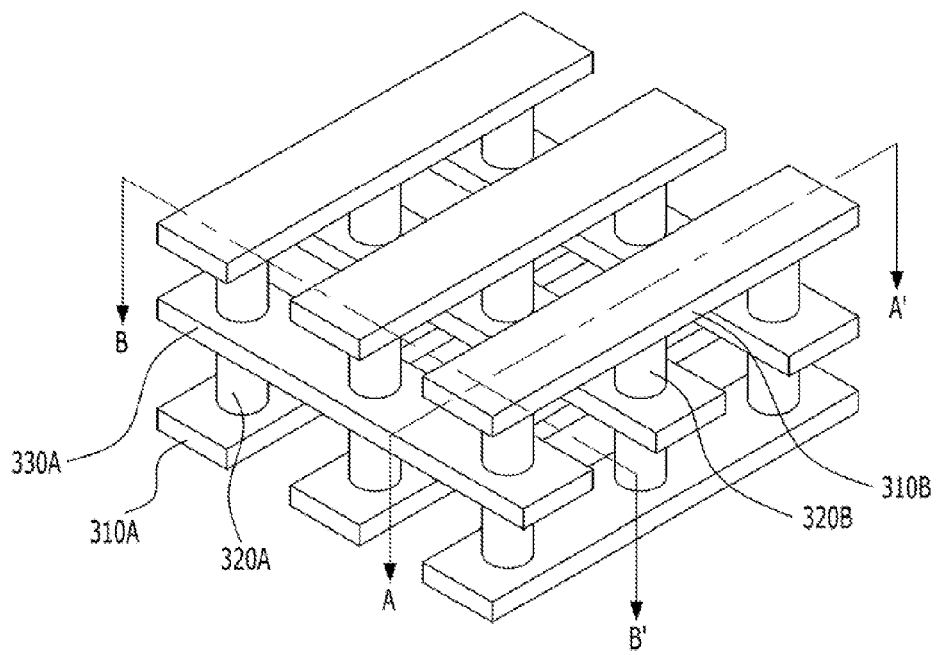
FIGS. 3A and 3B illustrate a variable resistance memory device in accordance with an embodiment of the present invention.
Figure 3B:
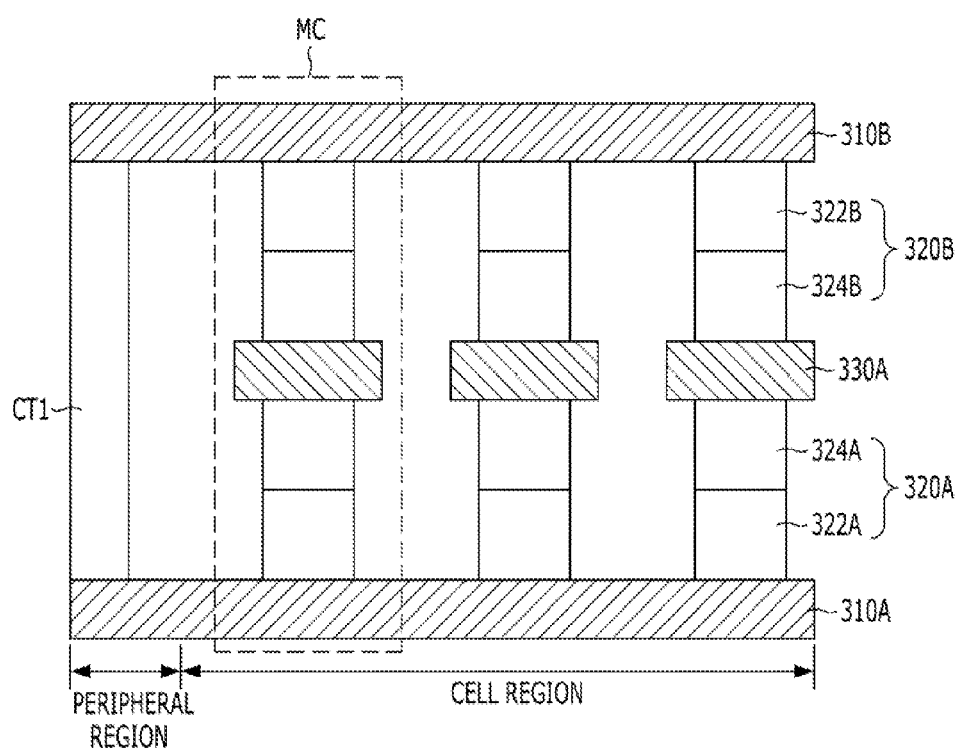

FIGS. 3A and 3B illustrate a variable resistance memory device in accordance with an embodiment of the present invention. FIG. 3A is a perspective view, and FIG. 3B is a cross-sectional view taken along a line A-A' of FIG. 3A and illustrates a cell region and a peripheral region not pointed out in FIG. 3A. FIGS. 3A and 3B illustrate a variable resistance memory device having a cross-point structure in which the above-described unit cell of FIG. 2E is formed at each intersection between a plurality of conductive lines extended in directions crossing each other.

Referring to FIGS. 3A and 3B, the variable resistance memory device in accordance with the embodiment of the present invention includes a pair of first conductive lines 310A and 310B positioned at the top and bottom thereof and extended in a first direction, a second conductive line 330A interposed between the pair of first conductive lines and extended in a second direction crossing the first direction, a first variable resistance material layer 320A interposed between the first conductive line 310A and the second conductive line 330A, and a second variable resistance material layer 320B interposed between the first conductive line 310B and the second conductive line 330A.

At this time, the first conductive line 310A may include a plurality of conductive lines extended in parallel to each other in the first direction, and the first conductive line 310B may include a plurality of conductive lines positioned at a different layer from the first conductive line 310A and extended in parallel to each other in the first direction. The second conductive line 330A may include a plurality of conductive lines positioned between the pair of first conductive lines 310A and 310B and extended in parallel to each other in the second direction. In such a case, the first variable resistance material layer 320A may be arranged at each intersection between the first conductive lines 310A and the second conductive lines 330A, and the second variable resistance material layer 320B may be arranged at each intersection between the first conductive lines 310B and the second conductive lines 330A. Accordingly, a unit cell MC is formed at each intersection between the pair of first conductive lines 310A and 310B and the second conductive lines 330A. In a conventional variable resistance memory device, at least three or four conductive lines are controlled in order to control two variable resistance materials. In this embodiment of the present invention, however, since the pair of first conductive lines 310A and 310B are connected to each other, the first and second resistance material layers 320A and 320B may be controlled by controlling two conductive lines.

Meanwhile, the variable resistance memory device in accordance with the embodiment of the present invention further includes a peripheral area in addition to the cell area where the unit cells MC are arranged. The pair of first conductive lines 310A and 310B may be extended to the peripheral area and may be electrically connected to each other through a first contact CT1 formed in the peripheral area. Accordingly, the pair of first conductive lines 310A and 310B are controlled together and receive the same voltage.

The above-described variable resistance memory device may be formed by the following fabrication method, for example.

First, a conductive material is deposited on a substrate (not illustrated), and subsequently patterned to form a first conductive line 310A. A first insulation layer (not illustrated) is formed to cover the first conductive line 310A, and a first variable resistance material layer 320A is buried in a space formed by selectively etching the first insulation layer. A conductive layer is deposited on the first variable resistance material layer 320A and the first insulation layer and patterned to form the second conductive line 330A. A second insulation layer (not illustrated) is formed to cover the second conducive line 330A, and a second variable resistance material layer 320B is buried in a space formed by selectively etching the second insulation layer. The first and second insulation layers in the peripheral region are selectively etched to form a hole exposing a part of the first conductive line 310A, and a first contact CT1 is formed by burying a conductive material in the hole. A conductive material is deposited on the second variable resistance material layer 320B and the second insulation layer and patterned to form a first conductive line 310B. At this time, the first conductive line 310B contacts the first contact CT1 so as to be electrically connected to the first conductive line 310A.

In the above-described embodiments of the present invention, the unit cell where two structures that each include a variable resistance material layer interposed between two electrodes are stacked to store two-bit data and the variable resistance memory device including the unit cell have been described, but the present invention is not limited thereto. For example, three or more structures each including a variable resistance material layer interposed between two electrodes may be stacked. In this case, the unit cell may store multi-bit data according to the number of stacked structures. Hereafter, referring to FIGS. 4A to 6, a unit cell capable of storing multi-bit data will be described.

Figure 4A:
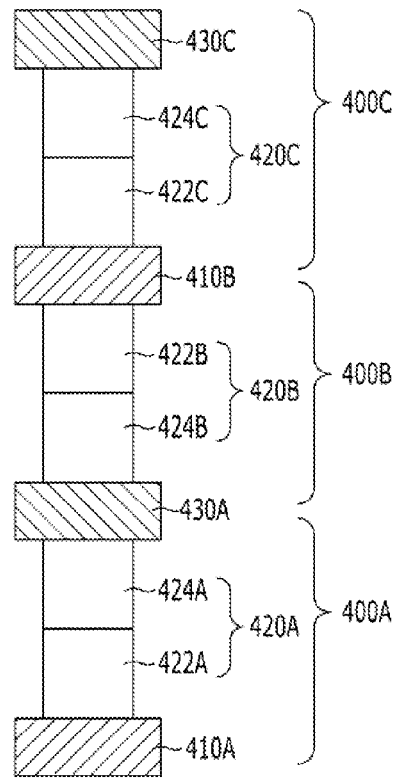
FIGS. 4A and 4B are diagrams illustrating a unit cell of a variable resistance memory device and an operation method thereof in accordance with another embodiment of the present invention.
Figure 4B:
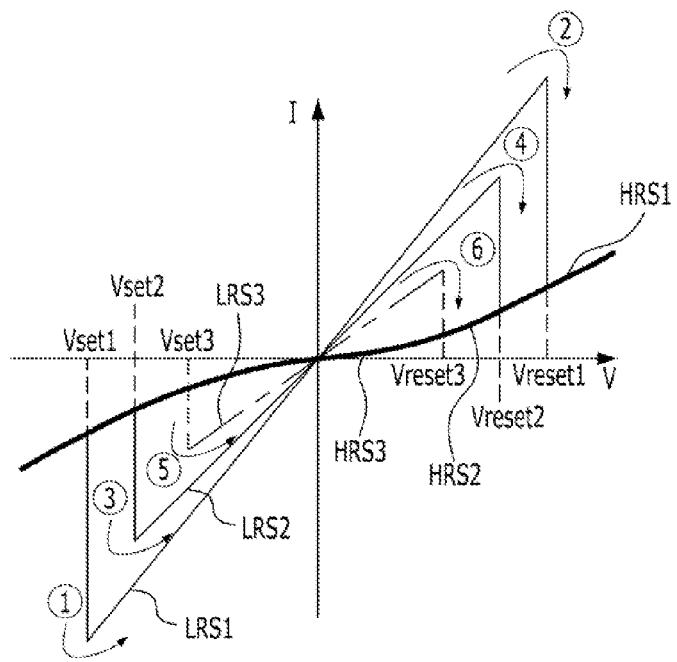

FIGS. 4A and 4B are diagrams illustrating a unit cell of a variable resistance memory device and an operation method thereof in accordance with another embodiment of the present invention.

Referring to FIGS. 4A and 4B, the unit cell of the variable resistance memory device in accordance with the embodiment of the present invention includes first to third structures 400A to 400C. At this time, each of the first to third structures 400A to 400C includes two electrodes and a variable resistance material layer interposed between the electrodes, where two adjacent structures share one electrode.

Specifically, the unit cell in accordance with the embodiment of the present invention includes two first electrodes 410A and 410B, two second electrodes 430A and 430C, first to third variable resistance material layers 420A to 420C disposed between the first electrodes 410A and 410B and the second electrodes 430A and 430C.

At this time, the first electrodes 410A and 410B may be electrically connected to each other through a conductor (not illustrated) and thus may be controlled together. Furthermore, the second electrodes 430A and 430C may be electrically connected to each other through a conductor (not illustrated) and thus be controlled together. Accordingly, voltages applied across the first to third variable resistance material layers 420A, 420B, and 420C, respectively, are equal to each other, according to an example.

At this time, each of the first to third variable resistance material layers 420A, 420B, and 420C includes a material switching between two resistance states in the bipolar mode depending on a voltage applied across the variable resistance material layer. The two resistance states include a low resistance state LRS1, LRS2, or LRS3 and a high resistance state HRS1, HRS2, or HRS3. Furthermore, a first set voltage Vset1 and a first reset voltage Vreset1 of the first variable resistance material layer 420A, a second set voltage Vset2 and a second reset voltage Vreset2 of the second variable resistance material layer 420B, and a third set voltage Vset1 and a third reset voltage Vreset3 of the third variable resistance material layer 420C are different from each other. For example, as illustrated in FIG. 4B, the third set voltage Vset3 and the third reset voltage Vreset3 may be the smallest, and the first set voltage Vset1 and the first reset voltage Vreset1 may be the largest.

Such a unit cell operates according to the following method.

First, suppose that all of the first to third variable resistance material layers 420A to 420C are in the high resistance states HRS1, HRS2, and HRS3. In this case, when a voltage applied across the first to third variable resistance material layers 420A to 420C is dropped, a set operation where the third variable resistance material layer 420C changes from the high resistance state HRS3 to the low resistance state LRS3 is performed at a time point where the voltage reaches the third set voltage Vset3 (refer to ⑤).

Then, when the voltage applied across the first to third variable resistance material layers 420A to 420C is further dropped, a set operation where the second variable resistance material layer 420B changes from the high resistance state HRS2 to the low resistance state LRS2 is performed at a time point where the voltage reaches the second set voltage Vset2 (refer to ③).

Then, when the voltage applied across the first to third variable resistance material layers 420A to 420C is further dropped, a set operation where the first variable resistance material layer 420A changes from the high resistance state HRS1 to the low resistance state LRS1 is performed at a time point where the voltage reaches the first set voltage Vset1 (refer to ①).

Then, when the voltage applied across the first to third variable resistance material layers 420A to 430C is gradually raised, the third variable resistance material layer 420C changes from the low resistance state LRS3 to the high resistance state HRS3 at the third reset voltage Vreset3, the second variable resistance material layer 420B changes from the low resistance state LRS2 to the high resistance state HRS2 at the second reset voltage Vreset2, and the first variable resistance material layer 420A changes from the low resistance state LRS1 to the high resistance state HRS1 at the first reset voltage Vreset1.

Accordingly, the unit cell in accordance with the embodiment of the present invention may have any one of six states according to the voltage condition. The six states include a first state where the first to third variable resistance material layers 420A to 420C are in the resistance states HRS1, HRS2, and HRS3, respectively, a second state where the first to third variable resistance material layers 420A to 420C are in the resistance states HRS1, HRS2, and LRS3, respectively, a third state where the first to third variable resistance material layers 420A to 420C are in the resistance states HRS1, LRS2, and LRS3, a fourth state where the first to third variable resistance material layers 420A to 420C are in the resistance states LRS1, LRS2, and LRS3, respectively, a fifth state where the first to third variable resistance material layers 420A to 420C are in the resistance states LRS1, LRS2, and HRS3, respectively, and a sixth state where the first to third variable resistance material layers 420A to 420C are in the resistance states LRS1, HRS2, and HRS3, respectively. That is, the unit cell may store six different data.

A read operation for reading data stored in the unit cell may be performed by applying a voltage ranging from the third set voltage Vset3 to the third reset voltage Vreset3 across the first to third variable resistance material layers 420A to 420C.

Figure 5A:
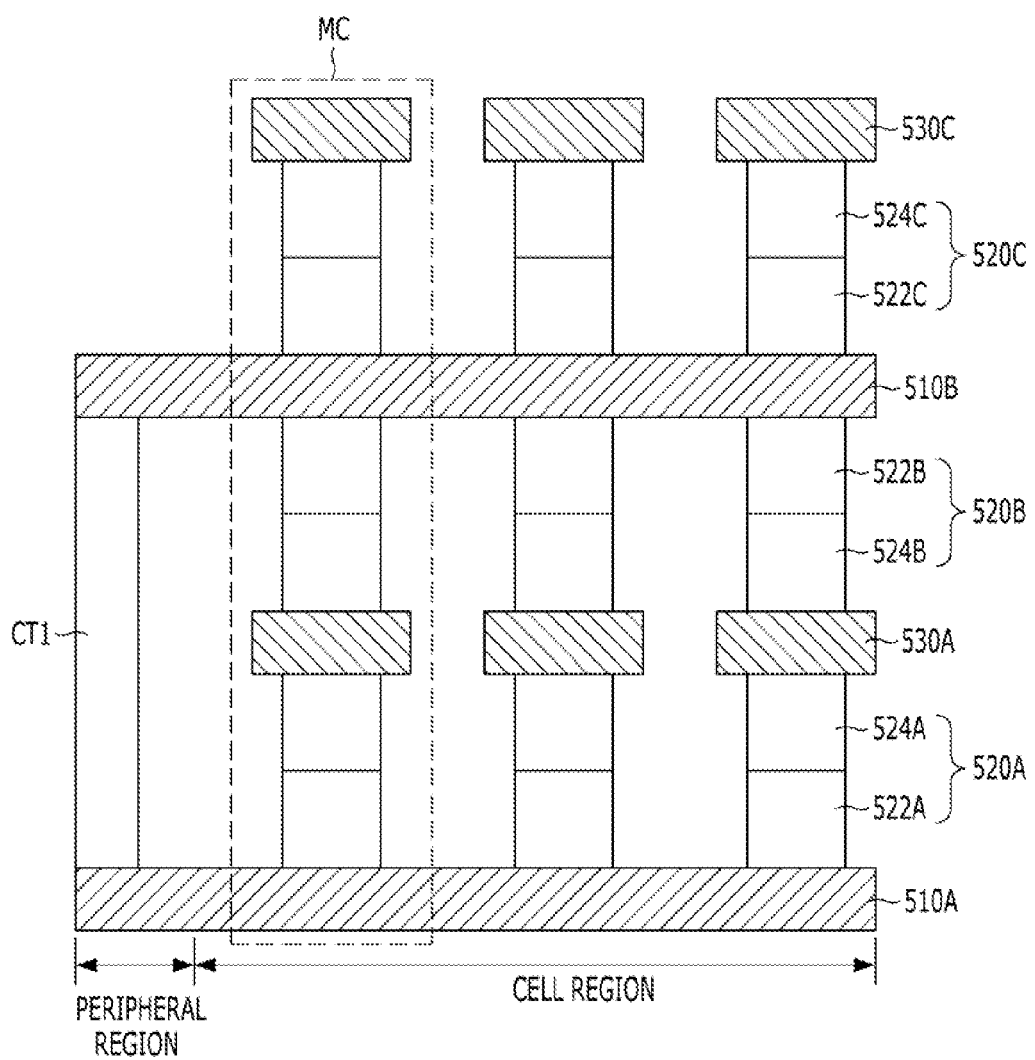
FIGS. 5A and 5B illustrate a variable resistance memory device in accordance with another embodiment of the present invention.
Figure 5B:
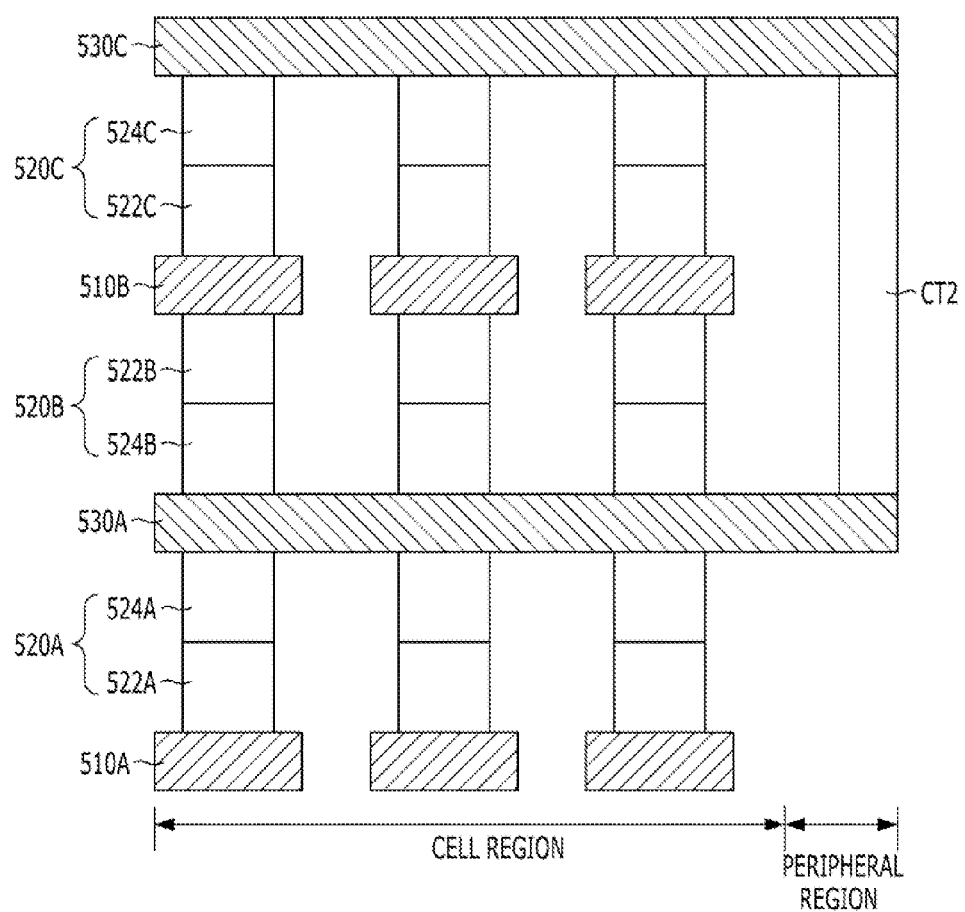

FIGS. 5A and 5B illustrate a variable resistance memory device in accordance with another embodiment of the present invention. FIG. 5A is a cross-sectional view taken along a first direction, that is, an extension direction of a first conductive line, and FIG. 5B is a cross-sectional view taken along a direction crossing the first direction, that is, an extension direction of a second conductive line. Furthermore, FIGS. 5A and 5B illustrate a variable resistance memory device having a cross-point structure in which the unit cell of FIG. 4A is formed at each intersection between a plurality of conductive lines extended in directions crossing each other.

Referring to FIGS. 5A and 5B, the variable resistance memory device in accordance with the embodiment of the present invention includes first conductive lines 510A and 510B and second conductive lines 530A and 530C, which are alternately arranged in a vertical direction, and first to third variable resistance material layers 520A to 520C interposed therebetween.

At this time, the first conductive line 510A may include a plurality of conductive lines extended in parallel to each other in a first direction, and the first conductive line 510B may include a plurality of conductive lines positioned at a different layer from the first conductive line 510A and extended in parallel to each other in the first direction. The second conductive line 530A may include a plurality of conductive lines positioned at a layer between the first conductive lines 510A and 510B and extended in parallel to each other in a second direction, and the second conductive line 530C may include a plurality of conductive lines positioned at a different layer from the second conductive line 530A and extended in parallel to each other in the second direction. Accordingly, a unit cell MC is formed at each intersection between the first conductive lines 510A and 510B and the second conductive lines 530A and 530C.

The first conductive lines 510A and 510B may extend in the peripheral region (as shown in FIG. 5A) and be electrically connected to each other through a first contact CT1 formed in the peripheral region. Also, as shown in FIG. 5B, the second conductive lines 530A and 530C may extend in the peripheral region and be electrically connected to each other through a second contact CT2 formed in the peripheral region.

Figure 6:
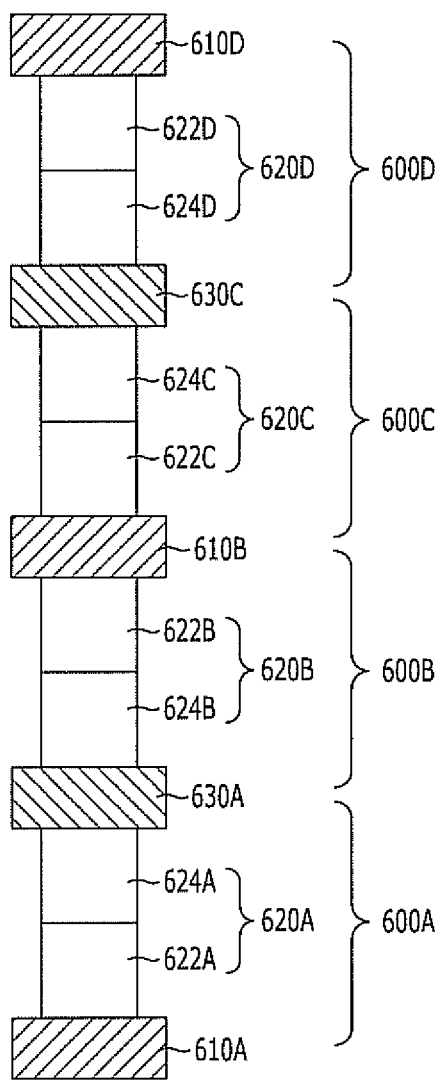
FIG. 6 is a diagram illustrating a unit cell of a variable resistance memory device in accordance with another embodiment of the present invention.

FIG. 6 is a diagram illustrating a unit cell of a variable resistance memory device in accordance with another embodiment of the present invention.

Referring to FIG. 6, the unit cell of the variable resistance memory device in accordance with the embodiment of the present invention includes first to fourth structures 600A to 600D, which are sequentially stacked. Each of the structures includes two electrodes and a variable resistance material layer interposed between the electrodes, and two adjacent structures share one electrode.

Specifically, the unit cell in accordance with the embodiment of the present invention includes three first electrodes 610A, 610B, and 610D and two second electrodes 630A and 630C, which are alternately arranged, and first to fourth variable resistance material layers 620A to 620D interposed therebetween.

The first electrodes 610A, 610B, and 610D may be electrically connected through a conductor (not illustrated) or the like. Furthermore, the second electrodes 630A and 630C may be electrically connected through a conductor (not illustrated) or the like.

Each of the first to fourth variable resistance material layers 620A to 620D includes a material switching between two resistance states, that is, a high resistance state and a low resistance state, depending on a voltage applied across the variable resistance material layer. The first to fourth variable resistance material layers 620A to 620D have different set voltages/reset voltages. Accordingly, the resistance states of the first to fourth variable resistance material layers 620A to 620D may be controlled separately from each other according to voltage conditions. Thus, multi-bit data may be stored. For example, when supposing that the magnitudes of the set voltages/reset voltages progressively decrease from the first variable resistance material layer 620A to the fourth variable resistance material layer 620D in that order, respectively, the unit cell may have any one of eight states. The eight states include a first state where the first to fourth variable resistance material layers 620A to 620D are in the resistance states HRS1, HRS2, HRS3, and HRS4, respectively, a second state where the first to fourth variable resistance material layers 620A to 620D are in the resistance states HRS1, HRS2, HRS3, and LRS4, respectively, a third state where the first to fourth variable resistance material layers 620A to 620D are in the resistance states HRS1, HRS2, LRS3, and LRS4, respectively, a fourth state where the first to fourth variable resistance material layers 620A to 620D are in the resistance states HRS1, LRS2, LRS3, and LRS4, respectively, a fifth state where the first to fourth variable resistance material layers 620A to 620D are in the resistance states LRS1, LRS2, LRS3, and LRS4, respectively, a sixth state where the first to fourth variable resistance material layers 620A to 620D are in the resistance states LRS1, LSR2, LSR3, and HRS4, respectively, a seventh state where the first to fourth variable resistance material layers 620A to 620D are in the resistance states LRS1, LRS2, HRS3, and HRS4, respectively, and an eight state where the first to fourth variable resistance material layers 620A to 620D are in the resistance states LRS1, HRS2, HRS3, and HRS4. Thus, eight different data may be stored.

The unit cell of FIG. 6 may be included in a variable resistance memory device having a cross-point structure similar to that described with reference to FIGS. 3A and 3B or FIGS. 5A and 5B, and thus, the detailed description thereof is omitted herein.

In the above-described embodiments of the present invention, the unit cell where two, three, or four structures each including a variable resistance material layer interposed between two first and second electrodes are stacked and the variable resistance memory device including the unit cell have been described. However, a unit cell where five or more structures are stacked and a variable resistance memory device including the unit cell may also be implemented.

Each of the structures includes two first and second electrodes and a variable resistance material layer interposed between the electrodes, and adjacent two structures share one electrode, that is, the first or second electrode. Accordingly, the first and second electrodes are alternately arranged in one direction. The first electrodes are electrically connected to each other and controlled together, and the second electrodes are electrically connected to each other and controlled together. The variable resistance material layers are interposed between the first and second electrodes, respectively.

Here, each of the variable resistance material layers may switch between the high resistance state and the low resistance state in the bipolar mode and has a different set voltage/reset voltage during switching. Since each of the variable resistance material layers has a different set voltage/reset voltage, the resistance state of the variable resistance material layer may be controlled by controlling a voltage. For example, suppose that N variable resistance material layers exist and thus N set voltages having a negative polarity and different magnitudes and N reset voltages having a positive polarity and different magnitudes exist. In this case, when a voltage applied across the N variable resistance material layers in a high resistance state is dropped, the variable resistance material layers having the corresponding set voltages switch to a low resistance state at time points where the voltage reaches the N set voltages, respectively. Furthermore, when a voltage applied across the N variable resistance material layer in a high resistance state is raised, the variable resistance material layers having the corresponding reset voltages switch to a high resistance state at time points where the voltage reaches the N resets voltages, respectively. Since a plurality of data may be stored according to a combination of the resistance states of the respective variable resistance material layers, a multi-level cell may be implemented.

While the present invention has been described with respect to the specific embodiments, it will be apparent to those skilled in the art that various changes and modifications may be made without departing from the spirit and scope of the invention as defined in the following claims.

What is claimed is:

1. A variable resistance memory device comprising:
   a pair of first electrodes and a second electrode interposed between the pair of first electrodes;
   a first variable resistance material layer interposed between one of the first electrodes and the second electrode; and
   a second variable resistance material layer interposed between the other of the first electrodes and the second electrode,
   wherein the pair of first electrodes are electrically connected to each other, and
   a first set voltage and a first reset voltage of the first variable resistance material layer are different from a second set voltage and a second reset voltage of the second variable resistance material layer, respectively.

2. The variable resistance memory device of claim 1, wherein the first and second set voltages have a first polarity and the first and second reset voltages have a second polarity different from the first polarity.

3. The variable resistance memory device of claim 1, wherein the variable resistance memory device has a first state where the first and second variable resistance material layers are in a high resistance state, a second state where the first variable resistance material layer is in a high resistance state and the second variable resistance material layer is in a low resistance state, a third state where the first and second variable resistance material layers are in a low resistance state, and a fourth state where the first variable resistance material layer is in a low resistance state and the second variable resistance material layer is in a high resistance state and is configured to switch between the first to fourth states according to a voltage applied across the plurality of variable resistance material layers.

4. The variable resistance memory device of claim 2, wherein the second set voltage has a smaller magnitude than the first set voltage and the second reset voltage has a smaller magnitude than the first reset voltage.

5. The variable resistance memory device of claim 4, wherein, when a voltage applied across the first and second variable resistance material layers in a high resistance state reaches the second set voltage, the second variable resistance material layer is configured to switch to a low resistance state,
   when a voltage applied across the second variable resistance material layer in a low resistance state and the first variable resistance material layer in a high resistance state reaches the first set voltage, the first variable resistance material layer is configured to switch to a low resistance state, when a voltage applied across the first and second variable resistance material layers in a low resistance state reaches the second reset voltage, the second variable resistance material layer is configured to switch to a high resistance state, and when a voltage applied across the second variable resistance material layer in a high resistance state and the first variable resistance material layer in a low resistance state reaches the first reset voltage, the first variable resistance material layer is configured to switch to a high resistance state.

6. The variable resistance memory device of claim 1, wherein, between the pair of first electrodes, one first electrode contacting the first variable resistance material layer comprises a plurality of conductive lines positioned at a first layer and extended in parallel to each other in a first direction, the other first electrode contacting the second variable resistance material layer comprises a plurality of conductive lines positioned at a second layer different from the first layer and extended in parallel to each other in the first direction, and the second electrode comprises a plurality of conductive lines positioned between the first and second layers and extended in parallel to each other in a second direction crossing the first direction.

7. The variable resistance memory device of claim 1, further comprising a contact having one end contacting one of the first electrodes and the other end contacting the other of the first electrodes.

8. The variable resistance memory device of claim 1, wherein at least one of a material, a width, and a thickness of the first variable resistance material layer is different from that of the second variable resistance material layer.

9. A variable resistance memory device comprising:
a plurality of first electrodes alternately stacked with a plurality of second electrodes; and
a plurality of variable resistance material layers interposed between different pairs of adjacent ones of the first electrodes and the second electrodes, respectively,
wherein the plurality of first electrodes are electrically connected to each other, the plurality of second electrodes are electrically connected to each other and the plurality of variable resistance material layers respectively have different set voltages and reset voltages.

10. The variable resistance memory device of claim 9, wherein each of the set voltages has a first polarity and each of the reset voltages has a second polarity different from the first polarity.

11. The variable resistance memory device of claim 9, wherein, the variable resistance memory device has a plurality of states based on combination of a resistance state of each of the variable resistance material layers and is configured to switch between the states according to a voltage applied across the plurality of variable resistance material layers.

12. The variable resistance memory device of claim 10, wherein, when the number of the variable resistance material layers is set to N and N is a natural number equal to or greater than three, the set voltages comprises N set voltages having different magnitudes, respectively, and the reset voltages comprises N reset voltages having different magnitudes, respectively.

13. The variable resistance memory device of claim 12, wherein, when a voltage applied across the plurality of variable resistance material layers in a high resistance state is progressively dropped and reaches each of the N set voltages, each respective variable resistance material layer having the corresponding set voltage switches to a low resistance state, and when a voltage applied across the plurality of variable resistance material layers in a low resistance state is progressively raised and reaches each of the N reset voltages, each respective variable resistance material layer having the corresponding reset voltage switches to a high resistance state.

14. The variable resistance memory device of claim 12, wherein the variable resistance memory device is configured to store 2N data according to a combination of a resistance state of each of the respective variable resistance material layers.

15. The variable resistance memory device of claim 9, wherein the plurality of first electrodes are disposed at different layers, respectively, the first electrode at each layer comprises a plurality of conductive lines extended in parallel to each other in a first direction, the plurality of second electrodes are disposed at different layers, respectively, the second electrode at each layer comprises a plurality of conductive lines extended in parallel to each other in a second direction crossing the first direction.

16. The variable resistance memory device of claim 9, further comprising:

a first contact interposed between respective ones of the first electrodes and connecting the first electrodes; and a second contact interposed between respective ones of the second electrodes and connecting the second electrodes.

17. The variable resistance memory device of claim 9, wherein at least one of a material, a width, and a thickness of one of the plurality of variable resistance material layers is different from that of another one of the plurality of variable resistance material layer.

18. A variable resistance memory device comprising:
a pair of first electrodes and a second electrode interposed between the pair of first electrodes;
a first variable resistance material layer interposed between one of the first electrodes and the second electrode; and
a second variable resistance material layer interposed between the other of the first electrodes and the second electrode,
wherein the pair of first electrodes are controlled together.

19. The variable resistance memory device of claim 18, wherein a first set voltage and a first reset voltage of the first variable resistance material layer are different from a second set voltage and a second reset voltage of the second variable resistance material layer, respectively.

20. The variable resistance memory device of claim 18, wherein the pair of first electrodes are electrically connected to each other.

* * * * *